(12) United States Patent
Wilklow et al.

(10) Patent No.: US 8,736,810 B2
(45) Date of Patent: May 27, 2014

(54) EUV RETICLE SUBSTRATES WITH HIGH THERMAL CONDUCTIVITY

(75) Inventors: Ronald A. Wilklow, Fairfield, CT (US); Michael L. Nelson, West Redding, CT (US); Michael Perry, Thomaston, CT (US)

(73) Assignee: ASML Holding N.V., Veldhoven (NL)

( * ) Notice: Subject to any disclaimer, the term of this patent is extended or adjusted under 35 U.S.C. 154(b) by 518 days.

(21) Appl. No.: 13/054,008

(22) PCT Filed: Jul. 29, 2009

(86) PCT No.: PCT/EP2009/005490
§ 371 (c)(1),
(2), (4) Date: Jan. 13, 2011

(87) PCT Pub. No.: WO2010/020337
PCT Pub. Date: Feb. 25, 2010

(65) Prior Publication Data
US 2011/0116068 A1   May 19, 2011

Related U.S. Application Data

(60) Provisional application No. 61/090,838, filed on Aug. 21, 2008.

(51) Int. Cl.
*G03B 27/42* (2006.01)
*G03F 1/00* (2012.01)

(52) U.S. Cl.
USPC ................................. 355/53; 430/5

(58) Field of Classification Search
USPC ............................ 355/53, 67; 430/5
See application file for complete search history.

(56) References Cited

U.S. PATENT DOCUMENTS 5,052,033 A   9/1991   Ikeda et al.
6,956,222 B2  10/2005  Gilissen et al.
(Continued)

FOREIGN PATENT DOCUMENTS

CN   1488994 A   4/2004
CN   1514307 A   7/2004
(Continued)

OTHER PUBLICATIONS

Chiba, A., et al., "Assessment of heat deformation and throughput for selecting mask substrate material for extreme ultraviolet lithography", *Japanese Journal of Applied Physics, Part 1*, 41(11A):6498-6505, Japan Society of Applied Physics, Japan (2002).

(Continued)

*Primary Examiner* — Peter B Kim
(74) *Attorney, Agent, or Firm* — Sterne, Kessler, Goldstein & Fox P.L.L.C.

(57) ABSTRACT

A reflective reticle substantially reduces or eliminates pattern distortion that results from the absorption of EUV radiation while maintaining a reticle thickness consistent with industry standards. The reflective reticle includes a layer of ultra-low expansion (ULE) glass and a substrate of Cordierite having a thermal conductivity substantially larger than that of ULE glass. An aluminum layer is disposed onto a first surface of the ULE glass and a second surface of the ULE glass is polished to be substantially flat and defect-free. The Cordierite substrate can be directly bonded to the aluminum layer using anodic bonding to form the reflective reticle. Alternatively, a first surface of an intermediate Zerodur layer can be bonded to the aluminum layer, and a second aluminum layer can be used to anodically bond the Cordierite substrate to a second surface of the Zerodur layer, thereby forming the reflective reticle.

20 Claims, 11 Drawing Sheets

(56) References Cited

U.S. PATENT DOCUMENTS

| | | |
|---|---|---|
| 7,129,010 B2 | 10/2006 | Alkemper et al. |
| 7,193,228 B2 | 3/2007 | Bowering et al. |
| 7,223,515 B1 | 5/2007 | Wolk et al. |
| 7,251,404 B2 | 7/2007 | Shelnut et al. |
| 7,251,405 B2 | 7/2007 | Shelnut et al. |
| 7,517,617 B2 | 4/2009 | Aschke et al. |
| 7,790,339 B2 | 9/2010 | Yoshikawa et al. |
| 7,850,814 B2 | 12/2010 | Majumdar et al. |
| 8,105,457 B2 | 1/2012 | Van Elp |
| 2004/0009410 A1 | 1/2004 | Lercel et al. |
| 2004/0063004 A1 | 4/2004 | Alkemper et al. |
| 2004/0079518 A1 | 4/2004 | del Puerto et al. |
| 2004/0166420 A1* | 8/2004 | Aschke et al. ............ 430/5 |
| 2006/0133756 A1 | 6/2006 | Shelnut et al. |
| 2006/0292459 A1 | 12/2006 | Kamm et al. |
| 2007/0097346 A1 | 5/2007 | Maria Zaal et al. |
| 2007/0170379 A1 | 7/2007 | Watson et al. |
| 2008/0266746 A1* | 10/2008 | Handa et al. ............ 361/234 |

FOREIGN PATENT DOCUMENTS

| | | |
|---|---|---|
| CN | 101030041 A | 9/2007 |
| CN | 101140416 A | 3/2008 |
| JP | 01-175734 A | 7/1989 |
| JP | 08-068898 A | 3/1996 |
| JP | 2004-320035 A | 11/2004 |
| JP | 2005-268359 A | 9/2005 |
| JP | 2006-177740 A | 7/2006 |
| JP | 2006-352134 A | 12/2006 |
| JP | 2007-523030 A | 8/2007 |
| JP | 2007-528608 A | 10/2007 |
| TW | 200628301 A | 8/2006 |
| TW | 200631773 A | 9/2006 |
| TW | 200632391 A | 9/2006 |
| TW | 200702759 A | 1/2007 |
| TW | 200806496 A | 2/2008 |
| WO | WO 00/75727 A2 | 12/2000 |

OTHER PUBLICATIONS

Dersch, U., et al. "Manufacturing of the first EUV full field Scanner Mask", *Proceedings of SPIE—The International Society for Optical Engineering—Photomask Technology* 2006, 6349(II), (2006).

Jonckheere, R., et al., "Assessment of EUV reticle blank availability enabling the use of EUV tools today and in the future", *Proceedings of SPIE—The International Society for Optical Engineering—EMLC* 2007, 6533(II), 23$^{rd}$ European Mask and Lithography Conference, France (2007).

International Search Report with the Written Opinion of the International Searching Authority directed to related International Application No. PCT/EP2009/005490, mailed Nov. 11, 2009, European Patent Office, Rijswijk, Netherlands; 11 pages.

International Preliminary Report on Patentability directed to related International Application No. PCT/EP2009/005490, mailed Mar. 3, 2011, The International Bureau of WIPO, Geneva, Switzerland; 2 pages.

\* cited by examiner

EUV RETICLE SUBSTRATES WITH HIGH THERMAL CONDUCTIVITY

BACKGROUND

1. Field of the Invention

The present invention relates to patterning devices for use in lithographic apparatus.

2. Related Art

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device (which is alternatively referred to as a mask or a reticle) generates a circuit pattern to be formed on an individual layer in an IC. This pattern may be transferred onto the target portion (e.g., including part of, one, or several dies) on the substrate (e.g., a silicon wafer). Transfer of the pattern is typically via imaging onto a layer of radiation-sensitive material (e.g., resist) provided on the substrate. In general, a single substrate contains a network of adjacent target portions that are successively patterned. Manufacturing different layers of the IC often requires imaging different patterns on different layers with different reticles. Therefore, reticles must be changed during the lithographic process.

Existing extreme-ultraviolet (EUV) lithographic apparatus incorporate reflective reticles having substrates formed from ultra-low expansion (ULE) glass, a glass-ceramic material having a coefficient of thermal expansion that is substantially zero across a wide range of operating temperatures. The selection of ULE glass as a substrate is based on the coefficient of thermal expansion of the ULE glass and on an ability to polish a surface of the ULE glass to the fine surface requirements necessary for EUV lithographic applications (i.e., surfaces that exhibit very low roughness, that are substantially free of defects, and that are substantially flat).

In general, existing reflective reticles for EUV lithographic apparatus exhibit a reflectance of approximately 70%. Therefore, depending on a pattern to be printed, an existing reflective reticle can absorb between approximately 30% and 100% of the energy of an incident EUV radiation beam. Such absorption can lead to significant heating of the reticle, which can distort the reticle surface, in spite of the relatively-low coefficient of thermal expansion of the ULE glass substrate, and introduce errors in the projected image.

Further, even if a back side of such a reflective reticle were optimally cooled, the absorption of EUV radiation could result in an excessively large thermal gradient across a thickness of a reticle having a ULE glass substrate. Such excessively-large thermal gradients can result from the relatively-low thermal conductivity of the ULE glass substrate, which promotes a relatively high thermal resistance within the ULE glass substrate and hence, within the reticle. One modification to existing reticle designs that would reduces the thermal resistance of the reticle is to thin the ULE glass substrate, and hence thin the reticle. However, this modification can produce extreme, and potentially insurmountable, difficulties in keeping the patterned surface flat. In addition, such a reticle would deviate from accepted industry thickness for EUV reflective reticles (e.g., approximately 6.35 mm±0.10 mm).

SUMMARY

Therefore, what is needed is a reflective reticle for use in EUV lithographic applications that substantially reduces or eliminates pattern distortion due to the absorption of EUV radiation, while maintaining a reticle thickness consistent with industry standards, thereby substantially obviating the drawbacks of the conventional systems.

In one embodiment, a reticle includes an optical layer having a first surface and a second surface. The reticle also includes a substrate having a thermal conductivity substantially larger than a thermal conductivity of the optical layer. A conductive layer is disposed between the optical layer and the substrate. The conductive layer is bonded to one or more of (i) a surface of the substrate and (ii) the first surface of the optical layer. For example, the optical layer can be a material having a substantially-zero coefficient of thermal expansion, the substrate can be a material having a substantially-zero coefficient of thermal expansion, and the conductive layer can be aluminum.

In an further embodiment, a lithographic apparatus includes an illumination system configured to produce a beam of radiation, a reticle configured to pattern the beam of radiation, and a projection system configured to project the patterned beam onto a target portion of a substrate. The reticle includes an a optical layer having a first surface and a second surface. The reticle also includes a substrate having a thermal conductivity substantially larger than a thermal conductivity of the optical layer. A conductive layer is disposed between the optical layer and the substrate, and the conductive layer is bonded to one or more of (i) a surface of the substrate and (ii) the first surface of the optical layer. For example, the optical layer can be a material having a substantially-zero coefficient of thermal expansion, the substrate can be a material having a substantially-zero coefficient of thermal expansion, and the conductive layer can be aluminum.

In a further embodiment, there is provided a method for making a reticle that disposes a layer of a conductive material onto a first surface of an optical layer. The layer of conductive material is then bonded to one of (i) a first surface of an intermediate layer or (ii) a surface of a substrate having a thermal conductivity substantially larger than a thermal conductivity of the optical layer.

In a further embodiment, there is provided a method for fabricating reticles for use in an extreme ultraviolet lithography (EUVL) system. A thick substrate is bonded to a thin film multilayer coating to provide an EUVL reticle having a first thermal conductivity that is relatively higher than a second thermal conductivity of a reflective lithography reticle formed with a single material layer.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 1A and 1B respectively depict reflective and transmissive lithographic apparatuses.

FIG. 2 depicts an example EUV lithographic apparatus.

FIG. 3 schematically depicts an existing reflective reticle for use in an EUV lithographic apparatus.

FIGS. 4A and 4B schematically depict features of an exemplary reflective reticle suitable for use in an EUV lithographic apparatus, according to an embodiment of the present invention.

FIGS. 5A and 5B schematically depict features of an exemplary reflective reticle suitable for use in an EUV lithographic apparatus, according to an additional embodiment of the present invention.

One or more embodiments of the present invention will now be described with reference to the accompanying drawings. In the drawings, like reference numbers can indicate identical or functionally similar elements.

DETAILED DESCRIPTION

I. Overview

Figure 1A:
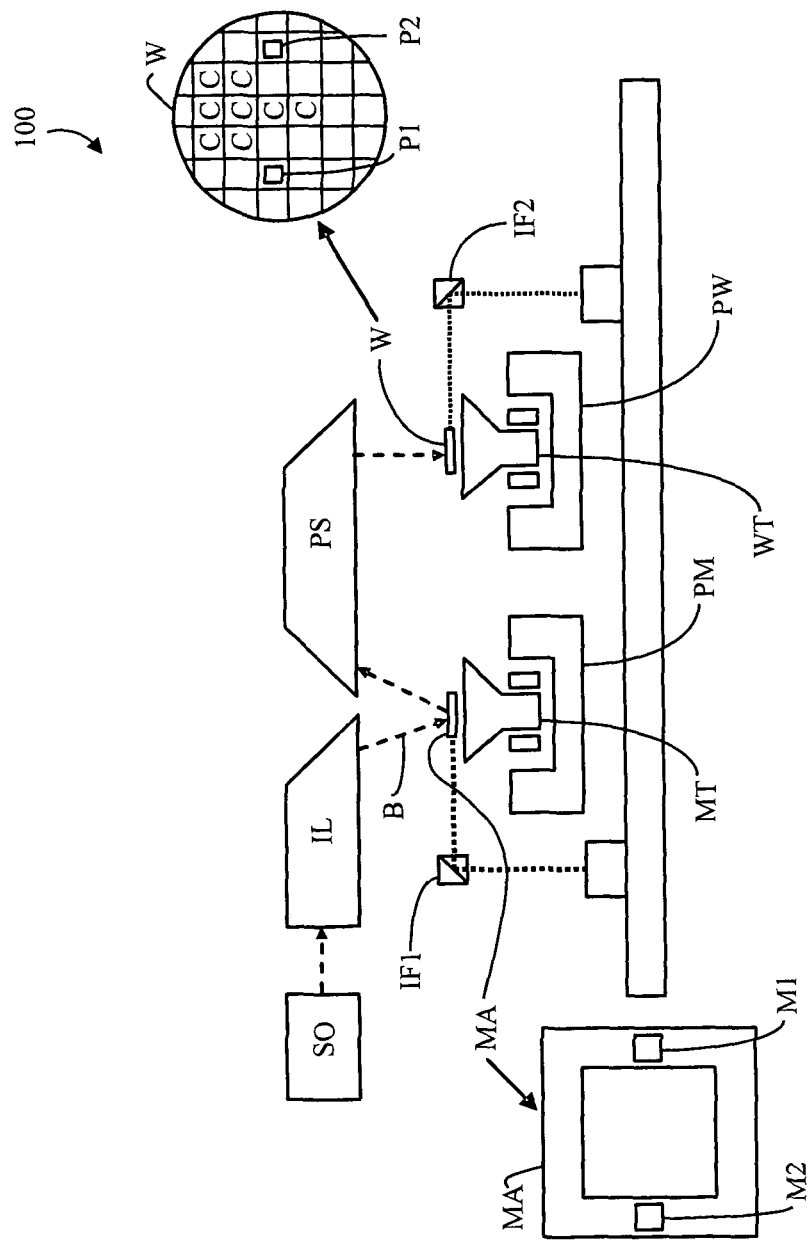

The present invention is directed to reticles that include substrates having high thermal conductivities, and in particular, to substrates for EUV reflective reticles having high thermal conductivities. This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In various embodiments, a reflective reticle suitable for use in an EUV lithographic apparatus includes an optical layer having a coefficient of thermal expansion that is substantially zero across a range of temperatures to which the reticle is exposed in the EUV lithographic apparatus. The optical layer includes a first surface, onto which a conductive layer is disposed, and a second surface, which can be polished to be substantially flat and substantially free of defects. For example, the optical layer can be formed from ultra-low expansion (ULE) titanium-silicate glass and the conductive layer can be aluminum.

In an embodiment, the conductive layer is bonded directly to a first surface of a substrate having a coefficient of thermal expansion that is substantially zero across a range of operating temperatures and a thermal conductivity substantially higher than that of the optical layer. In such an embodiment, the substrate can be formed from Cordierite, which has a thermal conductivity approximately three times larger than that of ULE glass. The bonded substrate and optical layer form a reticle suitable for use in EUV lithographic applications.

In an additional embodiment, a second conductive layer can be disposed onto a first surface of the substrate. Further, the first layer of conductive material can then be bonded to a first surface of an intermediate layer, and the second conductive layer can be bonded to a second surface of the intermediate layer. For example, the substrate can be formed from Cordierite, as described above, the intermediate layer can be formed from Zerodur, a non-porous, inorganic glass ceramic material, and the second conductive layer can be aluminum. In such an embodiment, the bonded optical layer, intermediate layer, and substrate form a reticle suitable for use in EUV lithographic applications.

These reflective reticles, as described below in their various embodiments, substantially reduce or eliminate pattern distortion that results from the absorption of EUV radiation, while maintaining a reticle thickness consistent with industry standards. As such, these reflective reticles substantially obviating the drawbacks of the existing EUV reticle technologies.

Before describing such embodiments in more detail, however, it is instructive to present an example environment in which embodiments of the present invention may be implemented.

II. An Example Lithographic Environment

A. Example Reflective and Transmissive Lithographic Systems

Figure 1B:
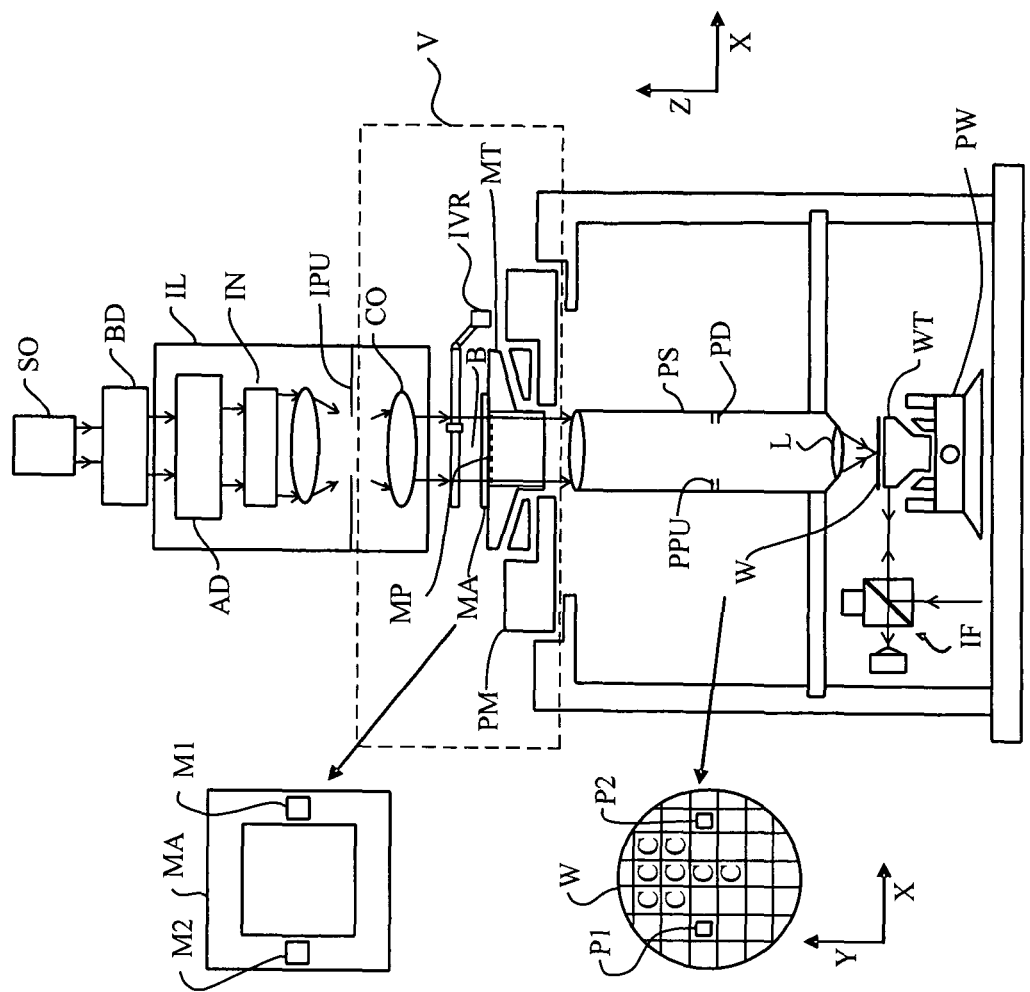

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as $\sigma_{outer}$ and $\sigma_{inner}$, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the magnification (or de-magnification) and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

B. Example EUV Lithographic Apparatus

Figure 2:
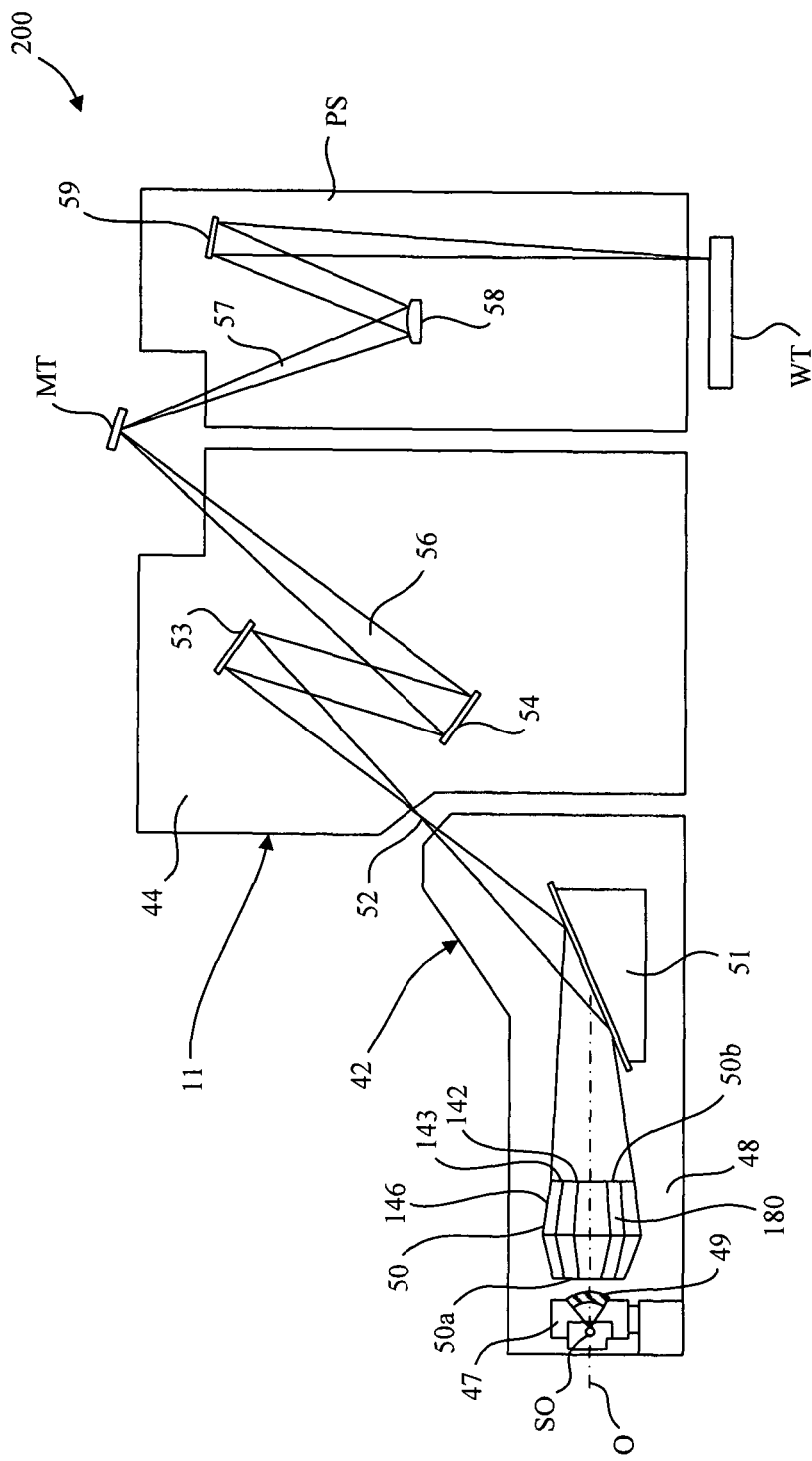

FIG. 2 schematically depicts an exemplary EUV lithographic apparatus 200 according to an embodiment of the present invention. In FIG. 2, EUV lithographic apparatus 200 includes a radiation system 42, an illumination optics unit 44, and a projection system PS. The radiation system 42 includes a radiation source SO, in which a beam of radiation may be formed by a discharge plasma. In an embodiment, EUV radiation may be produced by a gas or vapor, for example, from Xe gas, Li vapor, or Sn vapor, in which a very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 positioned in or behind an opening in source chamber 47. In an embodiment, gas barrier 49 may include a channel structure.

Collector chamber 48 includes a radiation collector 50 (which may also be called collector mirror or collector) that may be formed from a grazing incidence collector. Radiation collector 50 has an upstream radiation collector side 50a and a downstream radiation collector side 50b, and radiation passed by collector 50 can be reflected off a grating spectral filter 51 to be focused at a virtual source point 52 at an aperture in the collector chamber 48. Radiation collectors 50 are known to skilled artisans.

From collector chamber 48, a beam of radiation 56 is reflected in illumination optics unit 44 via normal incidence reflectors 53 and 54 onto a reticle or mask (not shown) positioned on reticle or mask table MT. A patterned beam 57 is formed, which is imaged in projection system PS via reflective elements 58 and 59 onto a substrate (not shown) supported on wafer stage or substrate table WT. In various embodiments, illumination optics unit 44 and projection system PS may include more (or fewer) elements than depicted in FIG. 2. For example, grating spectral filter 51 may optionally be present, depending upon the type of lithographic apparatus. Further, in an embodiment, illumination optics unit 44 and projection system PS may include more mirrors than those depicted in FIG. 2. For example, projection system PS may incorporate one to four reflective elements in addition to reflective elements 58 and 59. In FIG. 2, reference number 180 indicates a space between two reflectors, e.g., a space between reflectors 142 and 143.

In an embodiment, collector mirror 50 may also include a normal incidence collector in place of or in addition to a grazing incidence mirror. Further, collector mirror 50, although described in reference to a nested collector with reflectors 142, 143, and 146, is herein further used as example of a collector.

Further, instead of a grating 51, as schematically depicted in FIG. 2, a transmissive optical filter may also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 2, EUV transmissive optical filters may be included as additional optical elements, for example, configured upstream of collector mirror 50 or optical EUV transmissive filters in illumination unit 44 and/or projection system PS.

The terms "upstream" and "downstream," with respect to optical elements, indicate positions of one or more optical elements "optically upstream" and "optically downstream," respectively, of one or more additional optical elements. Following the light path that a beam of radiation traverses through lithographic apparatus 200, a first optical elements closer to source SO than a second optical element is configured upstream of the second optical element; the second optical element is configured downstream of the first optical element. For example, collector mirror 50 is configured upstream of spectral filter 51, whereas optical element 53 is configured downstream of spectral filter 51.

All optical elements depicted in FIG. 2 (and additional optical elements not shown in the schematic drawing of this embodiment) may be vulnerable to deposition of contaminants produced by source SO, for example, Sn. Such may be the case for the radiation collector 50 and, if present, the spectral purity filter 51. Hence, a cleaning device may be employed to clean one or more of these optical elements, as well as a cleaning method may be applied to those optical elements, but also to normal incidence reflectors 53 and 54 and reflective elements 58 and 59 or other optical elements, for example additional mirrors, gratings, etc.

Radiation collector 50 can be a grazing incidence collector, and in such an embodiment, collector 50 is aligned along an optical axis O. The source SO, or an image thereof, may also be located along optical axis O. The radiation collector 50 may comprise reflectors 142, 143, and 146 (also known as a "shell" or a Wolter-type reflector including several Wolter-type reflectors). Reflectors 142, 143, and 146 may be nested and rotationally symmetric about optical axis O. In FIG. 2, an inner reflector is indicated by reference number 142, an intermediate reflector is indicated by reference number 143, and an outer reflector is indicated by reference number 146. The radiation collector 50 encloses a certain volume, i.e., a volume within the outer reflector(s) 146. Usually, the volume within outer reflector(s) 146 is circumferentially closed, although small openings may be present.

Reflectors 142, 143, and 146 respectively may include surfaces of which at least portion represents a reflective layer or a number of reflective layers. Hence, reflectors 142, 143, and 146 (or additional reflectors in the embodiments of radiation collectors having more than three reflectors or shells) are at least partly designed for reflecting and collecting EUV radiation from source SO, and at least part of reflectors 142, 143, and 146 may not be designed to reflect and collect EUV radiation. For example, at least part of the back side of the reflectors may not be designed to reflect and collect EUV radiation. On the surface of these reflective layers, there may in addition be a cap layer for protection or as optical filter provided on at least part of the surface of the reflective layers.

The radiation collector 50 may be placed in the vicinity of the source SO or an image of the source SO. Each reflector 142, 143, and 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength λ of 365, 248, 193, 157 or 126 nm), extreme ultra-violet (EUV or soft X-ray) radiation (e.g., having a wavelength in the range of 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

III. Exemplary Substrates for EUV Reticles Having High Thermal Conductivities

Figure 3:
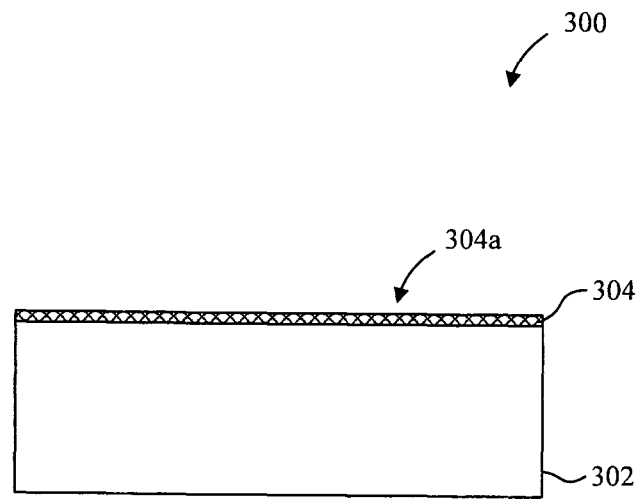

FIG. 3 schematically depicts an example of an existing EUV reflective reticle 300 that is formed from a single layer of substrate material. In FIG. 3, a reticle 300 includes a substrate 302 onto which one or more layers of highly-reflective material have been disposed to form a reflective layer 304. A pattern (not shown) can be formed onto a reflective surface 304a of layer 304 through chemical etching of a patterned layer of resist or, additionally or alternatively, through any other technique apparent to one skilled in the art.

Substrates of existing EUV reflective reticles, such as substrate 302, are often constructed from optical-grade glasses, ceramics, glass-ceramic materials, and other materials that are characterized by a relatively-low coefficient of thermal expansion and a high modulus of elasticity over a wide range of temperatures, e.g., including a range of temperatures to which the substrate is exposed in the EUV lithographic apparatus. For example, substrate 302 can be formed from ultra-low expansion titanium-silicate glass, such as that manufactured by Corning, Incorporated, of Corning, N.Y., and sold under the trademark ULE.

However, substrates constructed from these material also exhibit relatively-low values of thermal conductivity across the range of temperatures to which they are exposed in the EUV lithographic apparatus. For example, a mean thermal conductivity of ULE glass is approximately 1.31 W/(m-° C.) at 25° C., while that of aluminum is approximately 250 W/(m-° C.) at 25° C. Such values of thermal conductivity can lead to a relatively large thermal resistance across a thickness of the substrate (i.e., a quotient of the thickness of the substrate and its thermal conductivity), thereby inhibiting a uniform distribution of heat throughout the substrate and conduction of heat from the substrate to surrounding portions of the EUV lithographic apparatus, including, but not limited to one or more devices supporting the reticle.

As described above, existing EUV reticles an absorb between approximately 30% and 100% of the energy of an incident EUV radiation beam. Such absorption of EUV radiation by the reticle can result in localized heating of the substrate that, due to the mechanical properties of the substrate, is often unable to diffuse throughout the substrate or be conducted away from the substrate. In such instances, this heating can locally deform the substrate and therefore, a patterned surface of the corresponding reflective layer (e.g., surface 308a of reflective layer 308 in FIG. 3). Further, thermally-driven distortion of the pattern surface can distort the pattern imparted onto an incident radiation beam and introduce errors into an image projected by the EUV lithographic apparatus onto a substrate.

In general, existing EUV lithographic apparatus are unable to compensate for more than a small fraction of the errors introduced into the patterned image by the thermal distortion of the patterning surface. As such, the thermal distortion of both the patterned image and the patterning surface is a factor that limits imaging performance in existing EUV lithographic apparatus. Further, the problem of pattern distortion due to reticle heating will likely be exacerbated as more energy is delivered to reflective reticles to meet the increased throughput demands of volume manufacturing in EUV lithographic apparatus.

In an embodiment, the effects of localized reticle heating due to radiation absorption can be mitigated by increasing a thermal conductivity of a substrate in a reflective reticle. By increasing the thermal conductivity of the substrate, and thereby lowering a thermal resistance of the substrate (at a constant thickness), localized heating due to absorbed radiation can be more uniformly distributed throughout the substrate and can be more effectively conducted away from the substrate to surrounding support devices, including, but not limited to a reticle chuck or mask table. Therefore, an increase in the thermal conductivity of the reticle substrate can substantially reduce or eliminate any induced distortion of the patterning surface, and thus, any induced errors in the patterned image.

One suitable substrate material for inclusion into a reflective reticle for EUV lithographic apparatus is Cordierite, a ceramic material available from a number of suppliers, including, but not limited to, Hitachi Metals America Ltd. of Tarrytown, N.Y. Cordierite, while having a coefficient of thermal expansion that is substantially zero over the range of operating temperature experienced by EUV reticles, also has a thermal conductivity that is approximately three times larger than existing reticle substrate materials. For example, while ULE glass has a thermal conductivity of approximately 1.31 W/(m-° C.) at 25° C., a thermal conductivity of Cordierite at 25° C. is approximately 3.0 W/(m-° C.).

However, the microstructure of solid Cordierite renders the material unsuitable for use as a substrate in existing reflective reticles. Solid Cordierite incorporates microscopic voids that, upon polishing, form holes and other defects in a polished Cordierite surface. The presence of these surface defects renders the polished Cordierite surface unsuitable for the application of reflective materials to form a reflective layer of the reticle, e.g., reflective layer 308 of reticle 300 in FIG. 3.

Figure 4A:
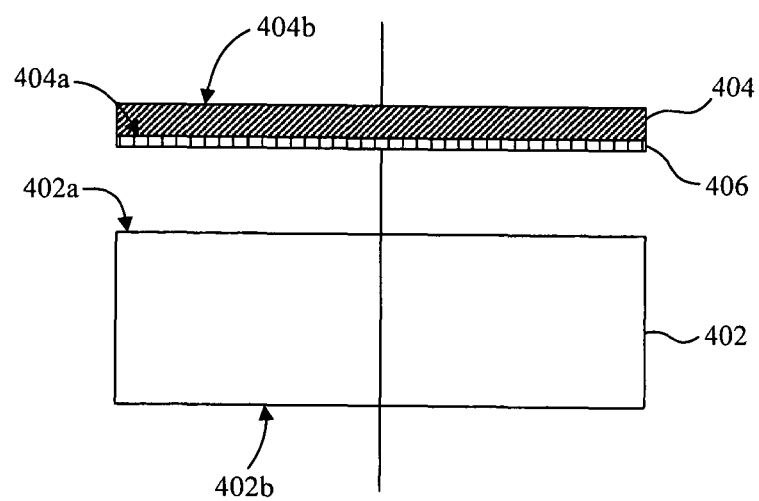
Figure 4B:
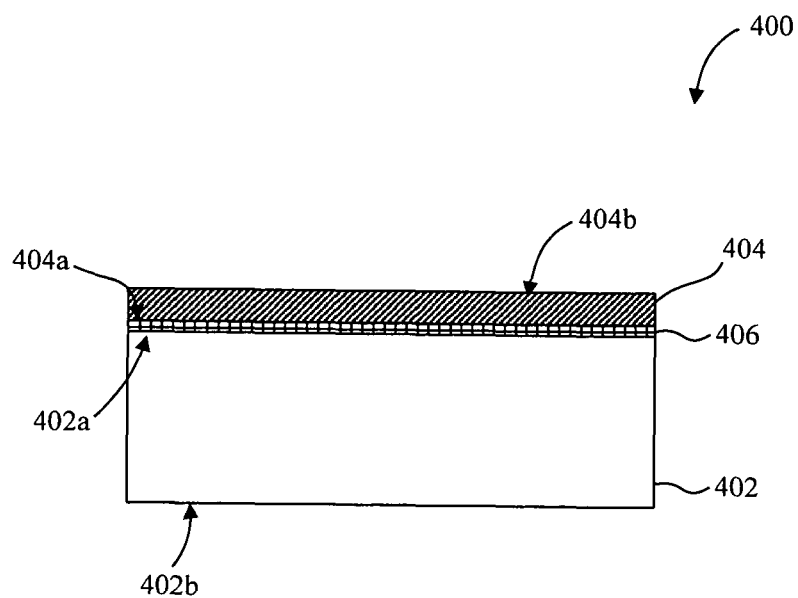

In an embodiment, the microstructural defects that render Cordierite unsuitable for use as a substrate in an existing reflective reticle can be remedied by binding a relatively-thin optical layer of material to a surface of the Cordierite substrate. In such an embodiment, and as depicted in FIGS. 4A and 4B, the thin optical layer can be processed (e.g., polished) to generate a substantially-flat surface that is free of those defects characteristic of polished Cordierite surfaces and is suitable for the application of reflective materials. In such an embodiment, the optical layer is sufficiently thin to provide a small thermal resistance, while providing a conventional glass surface on which to perform surface polishing, film application, and patterning.

FIG. 4A is an exploded, schematic view of an exemplary reflective reticle 400 suitable for use in a lithographic apparatus, according to an embodiment of the present invention. In contrast to existing reflective reticle technologies for EUV lithographic apparatus, such as that depicted in FIG. 3, reticle 400 includes a substrate 402, an optical layer 404, and conductive layer 406 disposed between substrate 402 and optical layer 404. In such an embodiment, the composite nature of reticle 400 substantially reduces or eliminates the distortion of the reticle surface and the introduction of errors in the patterned image due to the absorption of radiation that is characteristic of existing EUV reflective reticles.

In FIG. 4A, optical layer 404 has a first surface 404a and a second surface 404b, and substrate 402 has a first surface 402a and a second surface 402b. In such an embodiment, conductive layer 406 is disposed between first surface 404a of optical layer 404 and first surface 402a of substrate 402. Further, in an embodiment, conductive layer 406 can be disposed onto first surface 404a of optical layer 404.

In an embodiment, conductive layer 406 can be a metallic layer, including, but not limited to aluminum, a non-metallic conducting material, such as graphite, or any combination thereof. Further, in an embodiment, conductive layer 406 can be deposited onto first surface 404a of optical layer 404 through any of a number of deposition techniques apparent to one skilled in the art and appropriate to the materials. For example, conductive layer 406 can be deposited on first surface 404a of optical layer 404 using sputter deposition or spray deposition. In additional embodiments, conductive layer 406 can be pre-fabricated and bonded to first surface 404a of optical layer 404 using any additional or alternate technique appropriate to conductive layer 406 and optical layer 404.

FIG. 4B schematically depicts additional features of exemplary reticle 400 depicted in FIG. 4A. In FIG. 4B, reticle 400 has been formed by bonding conductive layer 406, which is disposed onto surface 404a, to a first surface 402a of substrate 402 to form reticle 400. In an embodiment, conductive layer 406 can be bonded to first surface 402a using any number of techniques apparent to one skilled in the art, including, but not limited to, anodic bonding.

In an embodiment, a second surface 402b of reticle 400 (and substrate 402) can be supported by a reticle chuck, mask table, or any other device within the EUV lithography apparatus. In such an embodiment, the reticle check, mask table, or other device can act as a heat sink for reticle 400, thereby facilitating the transfer of heat from reticle 400 to various components of the EUV lithographic apparatus.

In an embodiment, and as depicted in FIG. 4B, optical layer 404 can be bonded, or otherwise attached, to substrate 402 such that first layer 404a of optical layer 404 is substantially parallel with first surface 402a of substrate 402. Further, second surface 404b of optical layer 404 is also substantially parallel with first surface 404a, and similarly, second surface 402b of substrate 402 is substantially parallel with first surface 402a. However, the present invention is not limited to substrates and optical layers bonded or otherwise attached in such configurations. In an additional embodiments, respective first and second surfaces of substrate 402 and optical layer 404 can be oriented, respectively in any configuration, including, but not limited to, arranged at any angle with respect to each other, without departing from the spirit or scope of the present invention.

In an embodiment, and as described above, optical layer 404 can be formed from a material having a coefficient of thermal expansion that is substantially zero over a range of temperatures experienced by reticle 400. For example, optical layer 404 can be formed from ultra-low expansion (ULE) titanium silicate glass, which is manufactured by Corning, Incorporated, of Corning, N.Y. In such an embodiment, a thickness of optical layer 404 can be selected to maintain a relatively low thermal resistance, while providing a surface of sufficient integrity to support polishing and an application of reflective films. For example, the thickness of optical layer 404 could range from approximately 0.1 mm to approximately 0.5 mm, although thicknesses as low as approximately 0.025 mm may be possible.

Further, and as described above, substrate 402 can be formed from Cordierite, which has a substantially-zero coefficient of thermal expansion over the range of temperature and which also has a thermal conductivity approximately three times larger than that of the optical layer (e.g., Cordierite has a thermal conductivity of approximately 3.0 W/(m-°

C.) at 25° C., and ULE glass has a thermal conductivity of approximately 1.31 W/(m-° C.) at 25° C.). In an embodiment, a thickness of substrate 402 can range from approximately 5.25 mm to approximately 6.25 mm.

As described above, reticle 400, when incorporated into an EUV lithographic apparatus, can absorb between approximately 30% and 100% of an incident EUV radiation beam. However, in the embodiment of FIGS. 4A and 4B, localized heating of optical layer 404, which can result from absorption of EUV radiation, is rapidly diffused or conducted through optical layer 404 due to its low thermal resistance and through conductive layer 406 into substrate 402. Further, as the thermal conductivity of substrate 402 is substantially higher than a thermal conductivity of substrates of existing EUV reticles, localized heating due to absorption of EUV radiation uniformly diffuses throughout the substrate and is rapidly dissipated through the substrate into a reticle check, mask table, or other structure that supports reticle 400 within the EUV lithographic apparatus. Therefore, and in contrast to the existing EUV reticle depicted in FIG. 3, reticle 400 substantially reduces or eliminates any distortion of the reticle surface, and hence, any induced pattern errors, due to localized heating from absorbed EUV radiation.

In the embodiments of FIGS. 4A and 4B, conductive layer 406 is disposed on first surface 404a of optical layer 404, and conductive layer 406 is subsequently bonded to first surface 402a of substrate 402. However, in additional embodiments, an intermediate layer of material may further insulate optical layer 404 from substrate 402. For example, a substrate formed from Cordierite may not be sufficiently electrically conductive to be anodically bonded to conductive layer 406. In such an embodiment, the intermediate layer can be positioned between the substrate 402 and optical layer 404 to facilitate such anodic bonding.

Figure 5A:
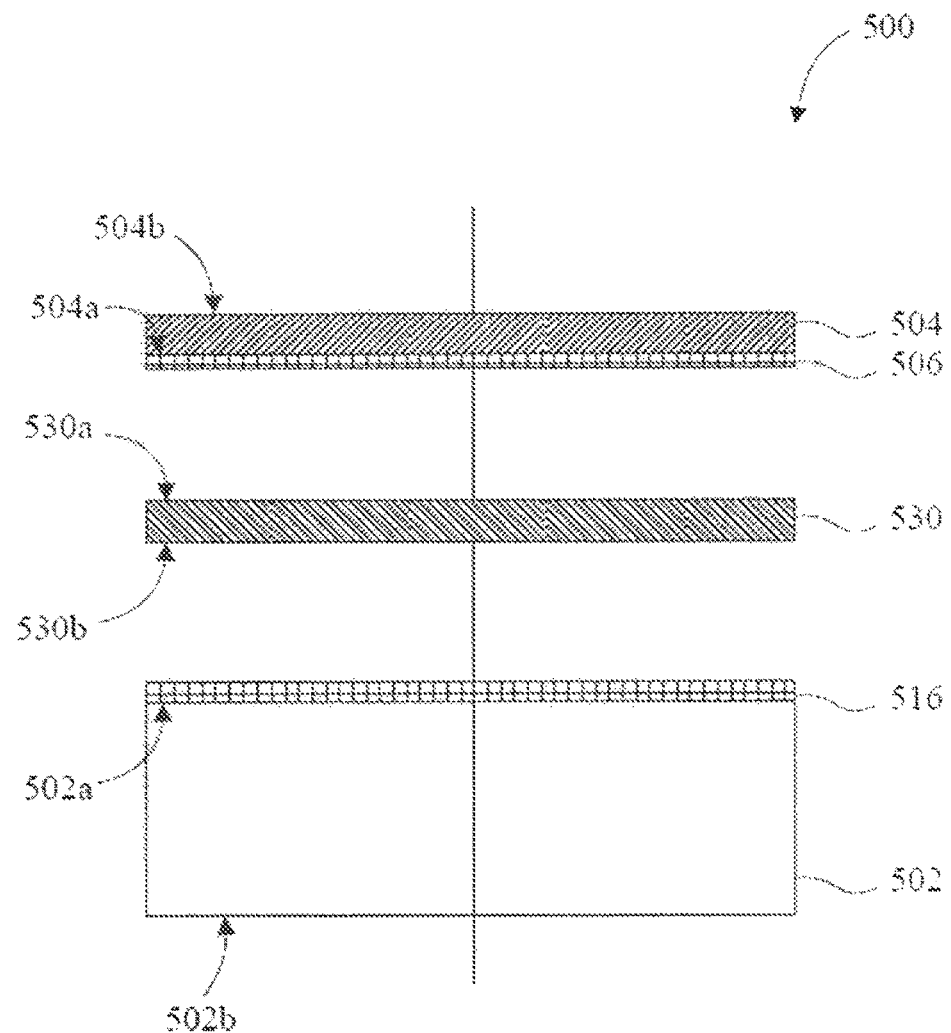

FIG. 5A is an exploded, schematic view of an exemplary reflective reticle 500 for use in an EUV lithographic system, according to an additional embodiment of the present invention. In contrast to the embodiment of FIG. 4, reticle 500 includes an intermediate layer 530 that separates substrate 502 from an optical layer 504. In such an embodiment, intermediate layer 530 facilitates bonding between optical layer 504 and substrate 502.

Similar to the embodiment of FIGS. 4A and 4B, an optical layer 504 has a first surface 504a and a second surface 504b. In an embodiment, second surface 504b can be processed to be substantially flat and free of defects through any of a number of techniques apparent to one skilled in the art, including, but not limited to polishing using various abrasive compounds.

A conductive layer 506 is disposed between first surface 504a of optical layer 504 and a first intermediate surface 530a of intermediate layer 530. In the embodiment of FIG. 5A, conductive layer 506 is disposed onto first surface 504a. However, the present invention is not limited to such configurations, and in additional embodiments conductive layer 506 may be disposed onto a first intermediate surface 530a of intermediate layer 530 without departing from the spirit or scope of the present invention.

In such embodiments, conductive layer 506 can be a metallic layer, including, but not limited to aluminum, a non-metallic conducting material, such as graphite, or any combination thereof. Further, in an embodiment, conductive layer 506 can be deposited onto first surface 504a of optical layer 504 (or alternatively, onto first intermediate surface 530a of intermediate layer 530) through any of a number of deposition techniques apparent to one skilled in the art and appropriate to the materials. For example, conductive layer 506 can be deposited on first surface 504a or first intermediate surface 530a using any sputter deposition, spray deposition, or physical vapor deposition technique.

In additional embodiments, conductive layer 506 can a pre-fabricated layer of conductive material. In such embodiments, pre-fabricated conductive layer 506 can be bonded to either first surface 504a of optical layer 504 or first intermediate surface 530a of intermediate layer 530 apparent to one skilled in the art and appropriate to the materials.

In further contrast to the embodiments of FIGS. 4A and 4B, a second conductive layer 516 is disposed between intermediate layer 530 and substrate 502. In the embodiment of FIG. 5A, second conductive layer 516 is disposed onto first surface 502a of substrate 502. However, the present invention is not limited to such a configuration, and in an additional embodiment, conductive layer 516 can be disposed onto a second intermediate surface 530b of intermediate layer 530 without departing from the spirit or scope of the present invention.

In such embodiments, and similar to those described above, conductive layer 516 can be a metallic layer, including, but not limited to aluminum, a non-metallic conducting material, such as graphite, or any combination thereof. Further, in an embodiment, conductive layer 516 can be deposited onto first surface 502a of substrate 502 (or alternatively, onto second intermediate surface 530b of intermediate layer 530) through any of a number of deposition techniques apparent to one skilled in the art and appropriate to the materials. For example, conductive layer 516 can be deposited on first surface 502a or second intermediate surface 530b using any sputter deposition, spray deposition, or physical vapor deposition technique.

Figure 5B:
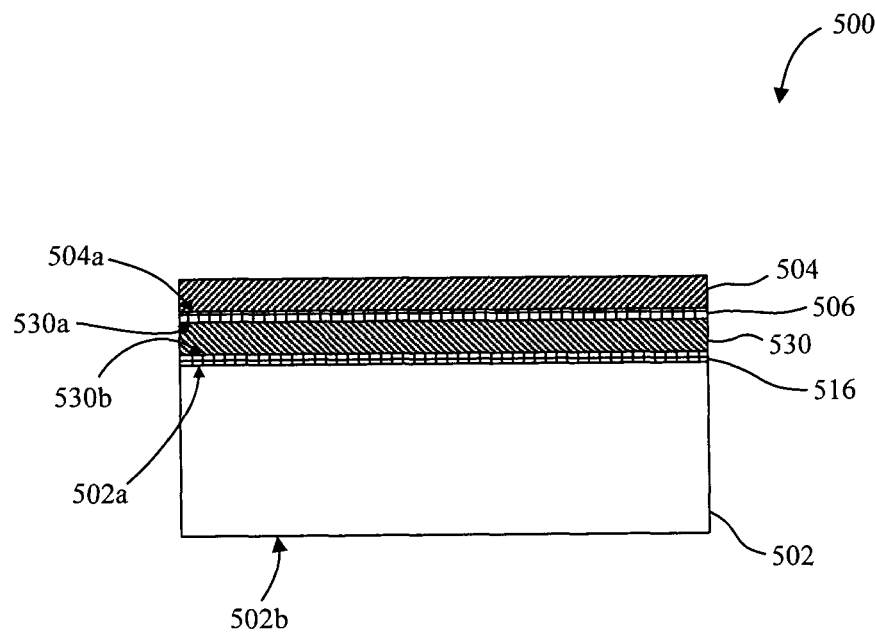

FIG. 5B schematically depicts additional features of reticle 500 depicted in FIG. 5A. In FIG. 5B, reticle 500 has been formed by first bonding conductive layer 506, as disposed onto first surface 504a of optical layer 504, to first intermediate surface 530a of intermediate layer 530, and by then bonding conducting layer 516, as disposed on first surface 502a of substrate 502, to second intermediate surface 530b of intermediate layer 530. In an embodiment, conductive layers 506 and 513 can be anodically bonded, respectively, to first and second intermediate surfaces 530a and 530b. However, the present invention is not limited to anodic bonding, and in additional embodiments, one or more of conductive layers 506 and 516 can be bonded or otherwise attached, respectively, to corresponding first and second intermediate surfaces 530a and 530b using any of a number of techniques apparent to one skilled in the art and appropriate to intermediate layer 530 and conductive layers 506 and 516.

In an embodiment, a second surface 502b of substrate 502 (and hence, reticle 500) can be supported by a reticle chuck, mask table, or any other device configured to support reticle 500 within the EUV lithography apparatus. In such an embodiment, the reticle check, mask table, or other device can act as a heat sink for reticle 500, thereby facilitating the transfer of heat from reticle 500 to various components of the EUV lithographic apparatus.

In the embodiment of FIGS. 5A and 5B, first and second surface 504a and 504b of optical layer 504, first and second surfaces 502a and 502b of substrate 502, and first and second intermediate surfaces 530a and 530b of intermediate layer 530 are all respectively, substantially mutually parallel. However, the present invention is not limited to substrates and optical layers bonded or otherwise attached in such configurations. In an additional embodiments, one or more of first and second surface 504a and 504b of optical layer 504, first and second surfaces 502a and 502b of substrate 502, and first and second intermediate surfaces 530a and 530b of intermediate layer 530 can be disposed at any angle with respect to any other surface that would be apparent to one skilled in the art and appropriate to reticle 500 without departing from the spirit or scope of the present invention.

In an embodiment, and as described above in reference to FIGS. 4A and 4B, optical layer 504 can be formed from a material having a coefficient of thermal expansion that is substantially zero over a range of temperatures experienced by reticle 500, including, but not limited to ultra-low expansion (ULE) titanium silicate glass. In such an embodiment, a thickness of optical layer 504 can be selected to maintain a relatively low thermal resistance and to provide a surface of sufficient integrity to support polishing. For example, the thickness of optical layer 504 could range from approximately 0.1 mm to approximately 0.5 mm, although thicknesses as low as approximately 0.025 mm may be possible.

Further, and as described above, substrate 502 can be formed from Cordierite, which has a substantially-zero coefficient of thermal expansion over the range of operating temperature and which also has a thermal conductivity approximately three times larger than that of the optical layer (e.g., Cordierite has a thermal conductivity of approximately 3.0 W/(m-° C.) at 25° C., and ULE glass has a thermal conductivity of approximately 1.31 3.0 W/(m-° C.) at 25° C.). In an embodiment, a thickness of substrate 502 can range from approximately 5.25 mm to approximately 6.25 mm.

Further, in the embodiment of FIGS. 5A and 5B, intermediate layer 530 can be formed from a glass material, a ceramic material, or a glass-ceramic material having a coefficient of thermal expansion that is substantially zero. For example, intermediate layer 530 may be formed from Zerodur, a non-porous, inorganic glass-ceramic material manufactured by Schott North America, Inc. of Elmsford, N.Y. Further, in an embodiment, a thickness of intermediate layer 530 may be substantially smaller than that of substrate 502 and selected such that a thermal resistance of the intermediate layer is substantially equivalent to or less than that of optical layer 504. For example, the thickness of an intermediate layer formed from Zerodur could range from approximately 0.1 mm to approximately 0.5 mm, although thicknesses as low as approximately 0.025 mm may be possible.

However, the present invention is not limited to intermediate layer formed from Zerodur, and in additional embodiments, intermediate layer 530 can be formed from any of a number of materials that have appropriate mechanical properties (e.g., substantially-zero coefficient of thermal expansion over a range of operational temperatures) and that are capable of facilitating anodic bonding with optical layer 504 and substrate 502.

As described above, reticle 500, when incorporated into an EUV lithographic apparatus, can absorb between approximately 30% and 100% of an incident EUV radiation beam. However, and similar to the embodiment of FIGS. 4A and 4B, any localized heating of optical layer 504, which can result from absorption of EUV radiation, is rapidly diffused (e.g., conducted) through the optical layer due to its low thermal resistance, through conductive layer 506 into intermediate layer 530, and subsequently through second conductive layer 516 and into substrate 502. Further, as the thermal conductivity of substrate 502 is substantially higher than the thermal conductivity in substrates of existing EUV reticles, localized heating of the substrate due to absorption of EUV radiation diffuses throughout the substrate and is dissipated through a reticle check, mask table, or other structure that supports reticle 500 within the EUV lithographic apparatus. Therefore, and in contrast to the existing EUV reticle depicted in FIG. 3, reticle 500 also substantially reduces or eliminates any distortion of the reticle surface, and hence, any induced pattern errors, due to localized heating from absorbed EUV radiation.

Figure 6:
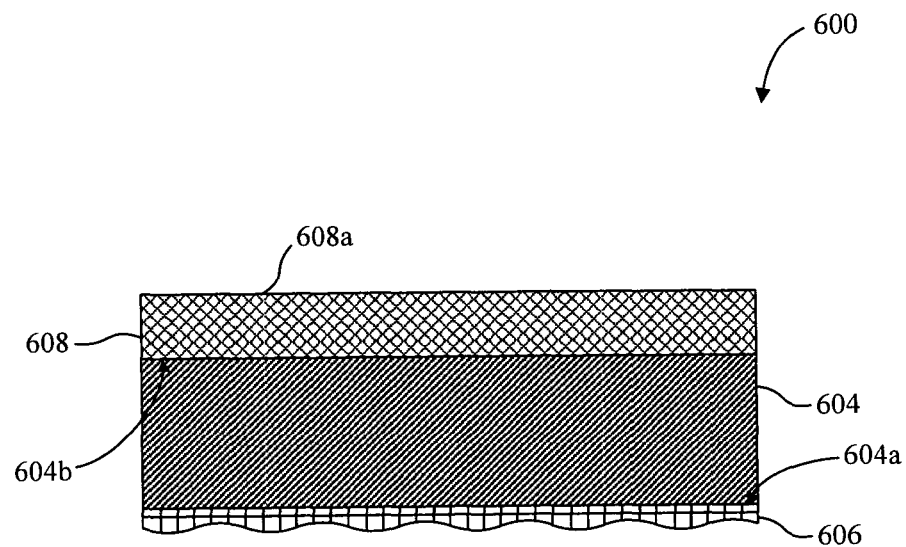
FIG. 6 depicts additional features of the exemplary reflective reticles of FIGS. 4A, 4B, 5A, and 5B.

FIG. 6 schematically depicts a portion of an exemplary reticle 600 (such as those depicted in FIGS. 4A-4B and FIGS. 5A-5B), after additional processing and patterning, according to an embodiment of the present invention. In FIG. 6, an optical layer 604 of a reticle 600 has a first surface 604a, onto which a conductive coating 606 is disposed, and a second surface 604b. In the embodiment of FIG. 6, second surface 604b is processed using any of a number of techniques apparent to one skilled in the art to generate a substantially-flat surface that is substantially free of any defects. In such an embodiment, a layer 608 of material that is highly-reflective to EUV radiation can be applied to polished surface 604b, and a pattern can be formed within the reflective layer. For an example, a layer of resist can be applied to layer 608, that resist layer can be exposed to radiation of an appropriate wavelength, and the exposed resist layer can be etched using any technique apparent to one skilled in the art to form a pattern on layer 608.

In an embodiment, a manufacturer of the reticle can apply highly-reflective layer 608 to surface 604b of optical layer 604. However, in additional embodiments, an end-user of reticle 600 can apply highly-reflective layer 608 to second surface 604b of optical layer 604 after reticle 600 is delivered to the user. Further, in an embodiment, the end-user of the reticle may also pattern highly-reflective layer 608 after delivery, as described above.

Figure 7:
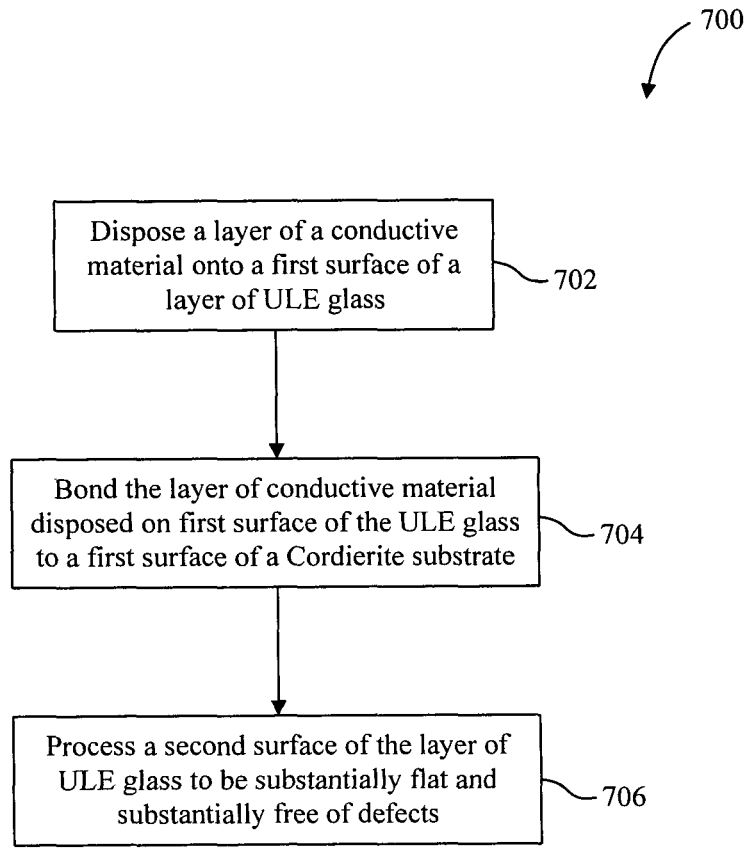
FIGS. 7 and 8 depict exemplary methods for making reflective reticles suitable for use in an EUV lithographic apparatus, according to embodiments of the present invention.

FIG. 7 is a flowchart of an exemplary method 700 for making a reticle, such as reticle 400 of FIGS. 4A and 4B, suitable for use in an EUV lithographic apparatus, according to an embodiment of the present invention. In step 702, a layer of a conductive material, including, but not limited to, aluminum, is disposed onto a first surface of a layer of ultra-low expansion (ULE) titanium-silicate glass. In such an embodiment, a thickness of the layer of ULE glass is selected such that a thermal resistance of the layer of ULE glass is relatively low across a range of temperatures.

In an embodiment, the conductive layer can be disposed onto the first surface of the layer of ULE glass using any of a number of deposition techniques apparent to one skilled in the art and appropriate to the materials. For example, step 702 can deposit the conductive layer onto the first surfaces of layer of ULE glass using any sputter deposition, spray deposition, or physical vapor deposition technique.

The conductive layer disposed on the layer of ULE glass is subsequently bonded in step 704 to a first surface of a Cordierite substrate to form the reticle. In an embodiment, step 704 anodically bonds the first surface of the Cordierite substrate to the conductive layer. However, in additional embodiments, the first surface of the Cordierite substrate can be bonded or otherwise attached to the conductive layer using any number of techniques apparent to one skilled in the art and appropriate to the Cordierite substrate and conductive layer without departing from the spirit or scope of the present invention.

A second surface of the layer of ULE glass is then processed in step 706 to form a substantially-flat surface that is substantially free from defects. In an embodiment, the second surface of the layer of ULE glass can be polished in step 706 to yield the substantially-flat and substantially-defectless surface. However, in an additional or alternate embodiment, the second surface may be processed in step 706 using any technique apparent to one skilled in the art without departing from the spirit or scope of the present invention.

Figure 8:
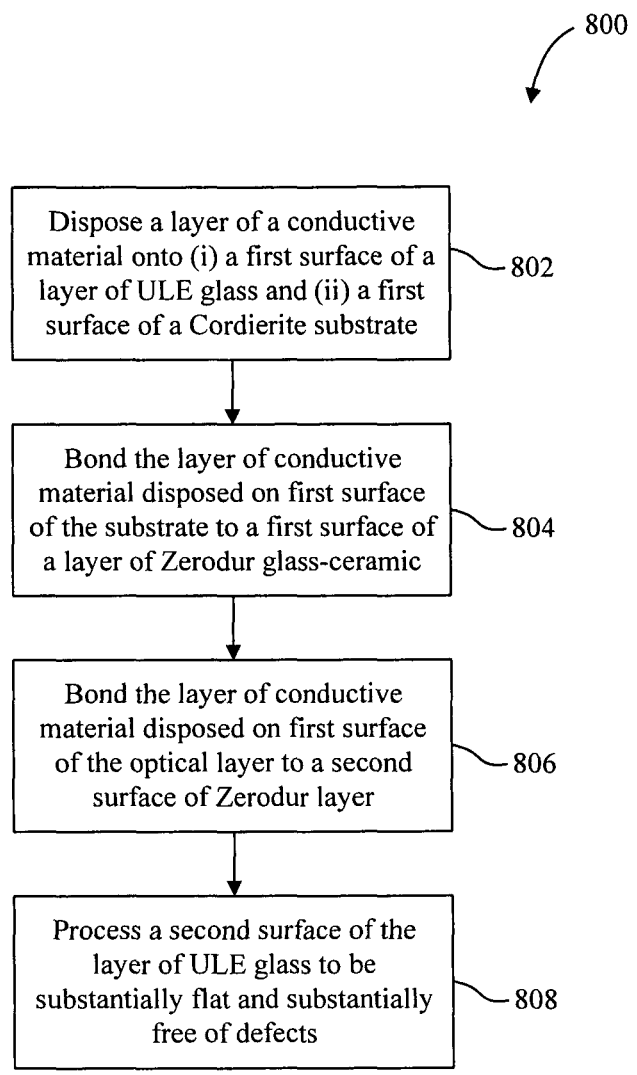

FIG. 8 is a flowchart of an exemplary method 800 for making a reticle, such as reticle 500 of FIGS. 5A and 5B, suitable for use in an EUV lithographic apparatus, according to an embodiment of the present invention. In step 802, a layer of a conductive material, including, but not limited to, aluminum, is disposed onto (i) a first surface of a layer of ultra-low expansion (ULE) titanium-silicate glass and (ii) onto a first surface of a Cordierite substrate. In an embodiment, a thickness of the ULE glass (or other optical layer) is selected such that a thermal resistance of the ULE glass (or other optical layer) is relatively low across an applicable range of temperatures.

In an embodiment, the conductive layer can be disposed onto the first surface of the layer of ULE glass and the first surface of the Cordierite substrate using any of a number of deposition techniques apparent to one skilled in the art and appropriate to the materials. For example, step 802 can deposit the conductive layer onto the first surfaces of layer of ULE glass and the Cordierite substrate using any sputter deposition, spray deposition, or physical vapor deposition technique.

The conductive layer disposed on the Cordierite substrate is subsequently bonded in step 804 to a first surface of a intermediate layer of Zerodur (e.g., layer 530 of FIGS. 5A and 5B). Further, in step 806, the conductive layer disposed on the layer of ULE glass is then bonded to a second surface of the Zerodur layer, thereby forming the reticle.

In an embodiment, one or more of the conductive layers can be anodically bonded to respective surfaces of the Zerodur layer in steps 804 and 806. However, in additional embodiments, the conductive layers can be bonded or otherwise attached to the respective surface of the Zerodur layer in steps 804 and 806 using any number of techniques apparent to one skilled in the art and appropriate to the Cordierite substrate and Zerodur layer without departing from the spirit or scope of the present invention.

A second surface of the layer of ULE glass is then processed in step 808 to form a substantially-flat surface that is substantially free from defect. In an embodiment, the second surface of the layer of ULE glass can be polished in step 808 to yield the substantially-flat and substantially-defectless surface. However, in an additional or alternate embodiment, the second surface may be processed in step 808 using any other technique apparent to one skilled in the art without departing from the spirit or scope of the present invention.

In an additional embodiment (not shown), a layer of material that is highly-reflective to EUV radiation can be applied to the polished surfaces of the reticles produced by the exemplary methods of FIGS. 7 and 8. Further, a pattern can be formed on the applied reflective layer using any of a number of techniques appropriate to the reflective material and the EUV lithography process, as would be apparent to one skilled in the art. For example, a layer of resist can be applied to polished surface, that resist layer can be exposed to radiation of an appropriate wavelength, and the exposed resist layer can be etched to form a pattern on polished surface. Further, in additional embodiments, such additional application and patterning steps can be performed by a manufacturer of the reticles prior to delivery to an end-user. Alternatively, the reticle can be manufactured using the methods of FIGS. 7 and 8, and the end-user can apply and pattern the reflective coating.

As described above with reference to FIGS. 5A and 5B, the present invention is not limited to intermediate layer formed from Zerodur. In additional embodiments, an intermediate layer can be formed from any of a number of materials that have appropriate mechanical properties (e.g., substantially-zero coefficient of thermal expansion over a range of operational temperatures) and that are capable of facilitating anodic bonding with the layer of ULE glass and the Cordierite substrate.

In the embodiments described above, reflective reticles are described in terms of an optical layer formed from ultra-low expansion (ULE) titanium-silicate glass. However, the optical layers of the present invention are not limited to such materials. In additional embodiments, the reflective reticles described herein can include an optical layer formed from any material (i) having a coefficient of thermal expansion that is substantially zero across a range of operating temperatures characteristic of the EUV lithography apparatus and (ii) capable of being processed to yield a substantially-flat surface that is substantially free of defects and amenable to the application of one or more layers of reflective material.

Further, in the embodiments described above, reticle substrates are described in terms of a Cordierite ceramic material. However, the reticle substrates of the present invention are not limited to such materials. In additional embodiments, the reticles described herein can include a substrate formed from any material (i) having a coefficient of thermal expansion that is substantially zero across a range of operating temperatures characteristic of the EUV lithography apparatus; (ii) a modulus of elasticity that is relatively high over that range of temperatures, and (iii) a thermal conductivity that is substantially higher than a thermal conductivity of the optical layer over that range of temperatures.

The reflective reticles of the present invention, as described herein through their various embodiments, substantially reduce or eliminate any distortion of the reticle surface, and hence, any induced pattern errors, due to localized heating from absorbed EUV radiation. Any localized heating of an optical layer is rapidly diffused through the optical layer due to its low thermal resistance and into the substrate. Further, as the thermal conductivity of the substrate is substantially higher than the thermal conductivity in substrates of existing EUV reticles, any localized heat flux received at the substrate due to absorption of EUV radiation diffuses throughout the substrate and is dissipated through the substrate and into a reticle check, mask table, or other structure that supports the reticle within the EUV lithographic apparatus. Therefore, and in contrast to the existing EUV reticle depicted in FIG. 3, the reticles of the present invention substantially reduce or eliminate thermal distortion of the patterning surface due to absorbed EUV radiation while maintaining a reticle thickness consistent with industry standards.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A reticle, comprising:
   an optical layer having a first surface and a second surface;
   a cordierite substrate; and
   a conductive layer disposed between the optical layer and the cordierite substrate, the conductive layer being bonded to one or more of (i) a surface of the cordierite substrate and (ii) the first surface of the optical layer.

2. The reticle of claim 1, wherein:
   the optical layer comprises a material having a substantially-zero coefficient of thermal expansion; and
   the cordierite substrate has a substantially-zero coefficient of thermal expansion.

3. The reticle of claim 1, wherein:
   a thermal conductivity of the cordierite substrate is larger than a thermal conductivity of the optical layer; and
   the conductive layer comprises aluminum.

4. The reticle of claim 1, wherein the conductive layer is disposed on the first surface of the optical layer.

5. The reticle of claim 4, further comprising:
   a second conductive layer disposed on the surface of the cordierite substrate; and
   an intermediate layer disposed between the conductive layer and the second conductive layer,
   wherein:
      the conductive layer is bonded to a first surface of the intermediate layer; and
      the second conductive layer is bonded to a second surface of the intermediate layer.

6. The reticle of claim 1, wherein the second surface of the optical layer is substantially flat and substantially free of defects.

7. The reticle of claim 6, further comprising a reflective layer disposed on the second surface of the optical layer.

8. The reticle of claim 1, wherein a thickness of the cordierite substrate is larger than a thickness of the optical layer.

9. A lithographic apparatus, comprising:
   an illumination system configured to produce a beam of radiation for a reticle that is configured to pattern the beam of radiation; and
   a projection system configured to project the patterned beam onto a target portion of a substrate,
   wherein the reticle comprises:
      an optical layer having a first surface and a second surface;
      a cordierite substrate; and
      a conductive layer disposed between the optical layer and the substrate, the conductive layer being bonded to one or more of (i) a surface of the substrate and (ii) the first surface of the optical layer.

10. The lithographic apparatus of claim 9, wherein:
    the optical layer comprises a material having a substantially-zero coefficient of thermal expansion; and
    the cordierite substrate has a substantially-zero coefficient of thermal expansion.

11. The lithographic apparatus of claim 9, wherein:
    a thermal conductivity of the cordierite substrate is larger than a thermal conductivity of the optical layer; and
    the conductive layer comprises aluminum.

12. The lithographic apparatus of claim 9, wherein the conductive layer is disposed onto the first surface of the optical layer.

13. The lithographic apparatus of claim 12, further comprising:
    a second conductive layer disposed on the surface of the cordierite substrate; and
    an intermediate layer disposed between the conductive layer and the second conductive layer,
    wherein:
       the conductive layer is bonded to a first surface of the intermediate layer; and
       the second conductive layer is bonded to a second surface of the intermediate layer.

14. A method for making a reticle, comprising:
    disposing a layer of conductive material onto a first surface of an optical layer; and
    bonding the layer of conductive material to one of (i) a first surface of an intermediate layer comprising a glass-ceramic material or (ii) a surface of a cordierite substrate having a thermal conductivity larger than a thermal conductivity of the optical layer.

15. The method of claim 14, wherein the disposing step comprises:
    disposing a layer of aluminum onto the first surface of the optical layer.

16. The method of claim 14, wherein the bonding step comprises:
    anodically bonding the layer of conductive material to one of (i) the surface of the intermediate layer or (ii) the surface of the cordierite substrate.

17. The method of claim 14, wherein the bonding step comprises:
    bonding the layer of conductive material to the first surface of the intermediate layer;
    disposing a second layer of a conductive material onto the surface of the cordierite substrate; and
    bonding the second layer of conductive material to a second surface of the intermediate layer.

18. The method of claim 14, wherein the bonding step comprises bonding the layer of conductive material to the surface of the cordierite substrate.

19. The method of claim 14, further comprising:
    processing a second surface of the optical layer to be substantially flat and substantially free of defects.

20. The method of claim 14, further comprising:
    applying a reflective coating to a second surface of the optical layer; and
    forming a pattern on the reflective coating.

* * * * *